United States Patent
Kwon

[11] Patent Number: 5,844,672
[45] Date of Patent: Dec. 1, 1998

[54] METHOD FOR COMPARING LENS DISTORTION BETWEEN TWO STEPPERS

[75] Inventor: Byung In Kwon, Kyungki-Do, Rep. of Korea

[73] Assignee: Hyundai Electronics Industries Co., Ltd., Kyungki-Do, Rep. of Korea

[21] Appl. No.: 959,542

[22] Filed: Oct. 24, 1997

Related U.S. Application Data

[63] Continuation of Ser. No. 666,884, Jun. 19, 1996, abandoned.

[30] Foreign Application Priority Data

Jun. 20, 1995 [KR] Rep. of Korea .................. 1995 16403

[51] Int. Cl.$^6$ ..................................................... G01B 11/00
[52] U.S. Cl. ............................................................. 356/124
[58] Field of Search .................................. 356/124, 124.5, 356/243

[56] References Cited

U.S. PATENT DOCUMENTS

| | | | |
|---|---|---|---|
| 5,402,224 | 3/1995 | Hirukawa et al. | 356/124 |
| 5,405,810 | 4/1995 | Mizumo et al. | 437/225 |
| 5,557,855 | 9/1996 | Hwang | 33/613 |
| 5,615,006 | 3/1997 | Hirukawa et al. | 356/124 |

*Primary Examiner*—F. L. Evans
*Attorney, Agent, or Firm*—Scott C. Harris, Esq.

[57] ABSTRACT

The mask for checking lens distortion comprises a plurality of mother verniers formed at each portion of the quartz and a plurality of the daughter verniers spaced from each of the plurality of the mother verniers.

1 Claim, 1 Drawing Sheet

METHOD FOR COMPARING LENS DISTORTION BETWEEN TWO STEPPERS

This is a continuation of application Ser. No. 08/666,884, filed Jun. 19, 1996, now abandoned.

FIELD OF THE INVENTION

The present invention relates to a mask for checking lens distortion in a stepper used in the exposure process of the semiconductor device manufacture.

BACKGROUND OF THE INVENTION

Generally, a lens is installed in the stepper used in the manufacturing process of the semiconductor device. In case the surface of the lens is manufactured unevenly, the desired pattern image will not be transferred onto the wafer because the pattern image passing through the lens will be distorted, thereby lowering the throughput in the device.

Accordingly, before a stepping process is performed, the distortion of the lens must be checked to determine the state of the lens. In a prior art, the conventional mask for checking a distortion, shown in FIG. 1 comprises a plurality of mother verniers 11 and one daughter vernier 12. The plurality of mother verniers 11 is formed on different portions of a quartz 10 and a daughter vernier 12 is formed on a specific portions, for example, the central portion of the quartz 10.

The method of checking a lens distortion in the stepper using the above mentioned mask will be explained below.

After the photoresist coated wafer is positioned at the stage of the stepper, a mask is mounted and the images of the plurality of the mother verniers 11 are transferred onto the photoresist with the mask fully open through a first exposure process. Thereafter, in response to the data input, the stage is moved so that the daughter vernier 12 of the mask is aligned to overlap with one of the mother verniers 11. In this position, an image of the daughter vernier 12 is passed onto the photoresist through a second stepping process using a blind leaving only the daughter vernier 12 of the mask open. Thus, as the stage is moved in response to the data input therein, this stepping process must be repeated for each of the mother verniers 11.

When the exposure process is completed, so that each image of the plurality of the mother verniers 11 transferred onto the photoresist overlaps with an image of the daughter vernier 12, a developing process is performed and the overlapped state of the mother verniers 11 and daughter vernier 12 is checked. The portions in which the mother vernier 11 and the daughter vernier 12 overlap exactly havd correspondingly good lens quality. If there is a portion in which the mother vernier 11 and the daughter vernier 12 do not precisely overlap, then that portion of the lens corresponding to it was distorted.

As such, in order to check the distortion of the lens using a conventional mask, the exposure process must be repeated for creating an overlapping image of the daughter veriner 12 with each of the mother verniers 11. The stage must be moved for each exposure process. Accordingly, much time will be required because several exposure processes must be completed and the exact distortion data may not be obtained because an error from the several movements of the stage can affect the distortion data of the lens.

SUMMARY OF THE INVENTION

Accordingly, the present invention is to provide a mask for checking lens distortion which can obtain exact distortion data through one exposure process to transfer an image of the mother verniers, with one stage movement, and a second exposure process to transfer an image of the daughter verniers overlapping the first image of the mother verniers.

The mask for checking a distortion according to the present invention for accomplishing the above mentioned purpose is characterized in that there are formed a plurality of mother verniers on different portions of a quartz and there are formed an equal number of daughter verniers uniformly spaced from each of the mother verniers on the quartz.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

Below, the present invention will be described in detail by reference to the accompanying drawings.

Figure 1:
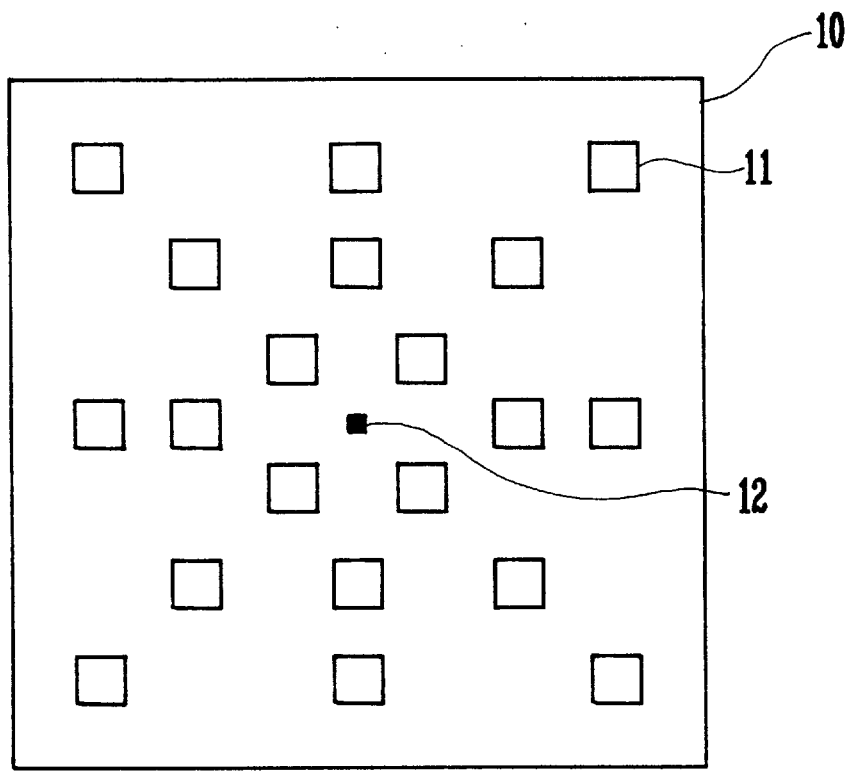
FIG. 1 is a top view of a conventional mask for checking lens distortion.
Figure 2:
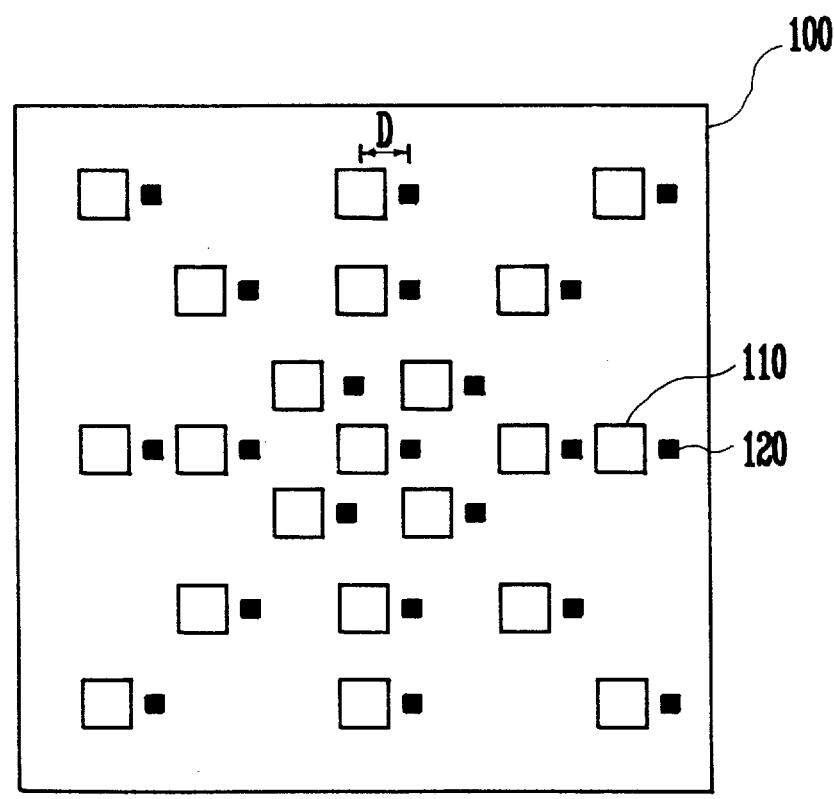
FIG. 2 is a top view of the mask for checking lens distortion in accordance with the present invention.

FIG. 2 is a top view of the mask for checking lens distortion in accordance with the present invention.

Referring to FIG. 2, the mask for checking lens distortion comprises a plurality of mother verniers 110 and a plurality of daughter verniers 120. The plurality of mother verniers 110 are formed on different portions of a quartz 100 and each of the plurality of daughter verniers 120 is formed to a space laterally by distance "D" from the plurality of the mother verniers 110 on the quartz 100.

The method of checking a lens distortion of the stepper using the above mentioned mask will be explained below.

After a photoresist coated wafer is positioned at the stage of the stepper, the mask is mounted and the image of the plurality of the mother verniers 110 is transferred onto the photoresist with the mask fully open through a first exposure process. Then, the stage is moved in response to the data input, that is, laterally by distance "–D" so that each of the plurality of the daughter verniers 120 in the mask overlaps with each of the plurality of mother verniers 110 the image of which was transferred onto the photoresist. An image of the plurality of the daughter verniers 120 is then transferred onto the photoresist through a second exposure process with the mask fully open.

On the other hand, we can see the difference of lens distortions between two(2) steppers when using the mask of the present invention.

After a photoresist coated wafer is positioned at the stage of the first stepper, the mask is mounted and the image of the plurality of the mother verniers 110 is transferred onto the photoresist with the mask fully open through a first exposure process. Then, after the wafer upon which the image of the plurality of the mother verniers 110 was transferred is positioned at the stage of a second stepper, the mask used in the the first stepper is mounted and then the stage is moved in response to the data input, that is, laterally by distance "–D", so that each of the plurality of the daughter verniers 120 in the mask 100 overlaps with each image of the plurality of the mother verniers 110 on the photoresist. Then an image of the plurality of the daughter verniers 120 is transferred onto the photoresist through a second exposure process with the mask fully open.

When the stepping process was completed transferring an image of each of the plurality of the mother verniers 110 overlapping with each of the plurality of the daughter verniers 120, a developing process permits the overlapped state of the developed mother verniers 110 and daughter verniers 120 to be evaluated.

In checking for lens distortion in a stepper, the portion of the developed image in which a mother vernier 110 and its the daughter vernier 120 overlap precisely indicates a good state for the corresponding portion of the lens. If there is a portion in which the mother vernier 110 and its daughter vernier 120 do not precisely overlap, then that corresponding portion of the lens is distorted.

In checking the difference in lens distortions of the first and second steppers, the portion in which the mother vernier 110 and the daughter vernier 120 exactly overlap correspondingly shows that the state of the lens in each of the first and second steppers is the same. If there is a portion in which the mother vernier 110 and the daughter vernier 120 do not precisely overlap, then this shows that the state of each lens in the first and second steppers is different.

As mentioned above, checking the lens distortion in the stepper using the mask of the present invention can shorten the check time because it can check the lens distortion in only two stepping processes which transfer the image of a plurality of mother verniers and an image of a plurality of daughter verniers. And, the present invention can obtain exact distortion data since it moves the stage only once, thereby preventing an error due to many movements of the stage affecting the distortion data of the lens. Also, the present invention can improve the compatibilities between the systems since it can compare the difference of the lens distortion between different steppers.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method for comparing lens distortion between a first stepper and a second stepper, comprising:

providing a mask formed on a quartz substrate having a first number of mother verniers formed at different locations on said quartz substrate relative to one another to form a first spatial pattern and a first number of daughter verniers formed on said quartz substrate with each of said daughter verniers being uniformly displaced relative to said mother verniers with a predetermined spacing in a common direction;

mounting said mask in said first stepper relative to a first imaging lens therein;

mounting a wafer having a photoresist coated thereon at a first stage of said first stepper relative to said mask and said first imaging lens;

performing a first exposure process with said mask which is fully opened in a first way so that images of said mother verniers are transferred onto said photoresist on said wafer;

transferring both said mask and said wafer after said first exposure from said first stepper onto said second stepper, said mask and said wafer being positioned relative to each other in a way substantially identical to a relative position of said mask and said wafer during said first exposure process in said first stepper;

moving said wafer laterally by said predetermined spacing relative to said mask in a direction opposite to said common direction so that said daughter verniers are aligned to overlap with said mother verniers;

performing a second exposure process with said mask which is fully opened in a second way so that images of said daughter verniers are transferred onto said photoresist on said wafer;

performing a developing process on said exposed photoresist on said wafer; and checking the overlapped state of patterns formed by said developing process to compare said difference in lens distortion of said first and second steppers.

* * * * *